United States Patent
Yamamoto et al.

(10) Patent No.: US 10,372,183 B2
(45) Date of Patent: Aug. 6, 2019

(54) STORAGE-BATTERY EVALUATION DEVICE, ENERGY STORAGE SYSTEM, AND STORAGE-BATTERY EVALUATION METHOD

(71) Applicant: KABUSHIKI KAISHA TOSHIBA, Minato-ku (JP)

(72) Inventors: Takahiro Yamamoto, Fuchu (JP); Shinichiro Kosugi, Yokohama (JP); Ryosuke Takeuchi, Shinagawa (JP); Masatake Sakuma, Kiyose (JP); Takahisa Wada, Yokohama (JP); Toru Ezawa, Kawasaki (JP); Takenori Kobayashi, Meguro (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 143 days.

(21) Appl. No.: 15/065,290

(22) Filed: Mar. 9, 2016

(65) Prior Publication Data

US 2017/0031404 A1    Feb. 2, 2017

Related U.S. Application Data

(63) Continuation of application No. PCT/JP2015/071873, filed on Jul. 31, 2015.

(51) Int. Cl.
*G01R 31/392* (2019.01)
*G06F 1/28* (2006.01)
(Continued)

(52) U.S. Cl.
CPC .............. *G06F 1/28* (2013.01); *G01R 31/392* (2019.01); *G06F 1/26* (2013.01); *G01R 31/3842* (2019.01)

(58) Field of Classification Search
CPC ........................................................ G06F 1/28
(Continued)

(56) References Cited

U.S. PATENT DOCUMENTS

| 7,009,401 B2 | 3/2006 | Kinoshita et al. |
| 2013/0158912 A1 | 6/2013 | Yen et al. |

(Continued)

FOREIGN PATENT DOCUMENTS

| AP | 2004-138586 A | 5/2004 |
| EP | 2 980 595 A1 | 2/2016 |

(Continued)

OTHER PUBLICATIONS

International Search Report dated Sep. 1, 2015 in PCT/JP2015/071873.

*Primary Examiner* — Jaweed A Abbaszadeh
*Assistant Examiner* — Sumil M Desai
(74) *Attorney, Agent, or Firm* — Oblon, McClelland, Maier & Neustadt, L.L.P.

(57) ABSTRACT

According to one embodiment, a storage-battery evaluation device includes: a data generator and a deterioration evaluator. The data generator generates a plurality of data items including charge amounts and voltage values of an energy storage device based on current values and the voltage values measured from the energy storage device, the energy storage device being subjected to charge/discharge control in accordance with charge/discharge command values. The deterioration evaluator evaluates a deterioration state of the energy storage device based on a distribution of the voltage values included in the data items the charge amounts of which belong to a first charge-amount range when it is detected that a distribution of first charge/discharge command values satisfies a predetermined condition, the first charge/discharge command values being the charge/dis- (Continued)

charge command values at which the data items the charge amounts of which belong to the first charge-amount range is obtained.

15 Claims, 12 Drawing Sheets

(51) Int. Cl.
    *G06F 1/26*      (2006.01)
    *G01R 31/3842*      (2019.01)

(58) Field of Classification Search
    USPC ........................................................ 713/340
    See application file for complete search history.

(56) References Cited

U.S. PATENT DOCUMENTS

| | | | | |
|---|---|---|---|---|
| 2013/0314050 A1* | 11/2013 | Matsubara | ............... | H02J 7/00 320/134 |
| 2015/0046109 A1 | 2/2015 | Miwa et al. | | |
| 2015/0180006 A1* | 6/2015 | Maguire | ............... | H01M 2/206 429/121 |
| 2016/0003918 A1* | 1/2016 | Wada | ........................ | H02J 3/32 320/134 |
| 2016/0011274 A1 | 1/2016 | Morita et al. | | |
| 2016/0064970 A1* | 3/2016 | Shimizu | .................. | H02J 3/386 320/134 |
| 2016/0116547 A1 | 4/2016 | Hanyu et al. | | |
| 2016/0321594 A1* | 11/2016 | Linde | ............... | G06Q 10/06395 |
| 2016/0370432 A1 | 12/2016 | Sakuma et al. | | |

FOREIGN PATENT DOCUMENTS

| | | |
|---|---|---|
| JP | 2004-14403 A | 1/2004 |
| JP | 2007-311256 A | 11/2007 |
| JP | 2013-225441 A | 10/2013 |
| JP | 2014-190763 A | 10/2014 |
| JP | 2014-224706 A | 12/2014 |
| JP | 2015-31674 A | 2/2015 |
| JP | 2015-60761 A | 3/2015 |
| JP | 2016-85166 | 5/2016 |
| WO | WO 2015/041091 A1 | 3/2015 |
| WO | WO 2015/041093 A1 | 3/2015 |
| WO | WO 2016/135913 A1 | 9/2016 |
| WO | WO 2016/203587 A1 | 12/2016 |

* cited by examiner

ELAPSED TIME

ELAPSED TIME

STORAGE-BATTERY EVALUATION DEVICE, ENERGY STORAGE SYSTEM, AND STORAGE-BATTERY EVALUATION METHOD

CROSS REFERENCE TO RELATED APPLICATIONS

This application is a Continuation of International Application No. PCT/JP2015/071873, filed on Jul. 31, 2015, the entire contents of which is hereby incorporated by reference.

FIELD

An embodiment of the present invention relates to a storage-battery evaluation device, an energy storage system, and a storage-battery evaluation method.

BACKGROUND

An energy storage system (ESS: Energy Storage System) is provided with a charge/discharge function and is used for improving electric power quality such as stabilization of the electric power supplied by a power grid system and suppression of frequency variations in the power grid system. The energy storage system is also used for reducing the peak usage amounts of consumers. Such an energy storage system is expected to expand a market in the future.

For a use to improve the electric power quality of the system, the energy storage system basically works 24 hours a day, 356 days. Therefore, when the deterioration of the energy storage system is to be evaluated, it is desired to evaluate the deterioration without stopping the function of the energy storage system. A current mainstream is to estimate deterioration based on charge/discharge histories. However, state evaluation in the working of a long period such as 20 years has not yet been realized. Meanwhile, there is a method of carrying out deterioration estimation by monitoring and remote monitoring of the energy storage system; however, this has not yet been realized too. In an energy storage system for a vehicle-mount use or an electricity-distribution-side use, the working energy storage system can be stopped; therefore, precise deterioration evaluation can be carried out by stopping the energy storage system and actually carrying out a charge/discharge test. However, in an energy storage system for the use to improve electric power quality in the power grid system, the working energy storage system cannot be stopped; therefore, this method is not realistic.

CITATION LIST

Patent Document

Patent Document 1: Japanese Patent Application Laid-Open No. 2015-31674

DETAILED DESCRIPTION

An embodiment of the present invention is to evaluate deterioration of an energy storage system without stopping the function of the energy storage system.

According to one embodiment, a storage-battery evaluation device includes: a data generator and a deterioration evaluator. The data generator generates a plurality of data items including charge amounts and voltage values of an energy storage device based on current values and the voltage values measured from the energy storage device, the energy storage device being subjected to charge/discharge control in accordance with charge/discharge command values. The deterioration evaluator evaluates a deterioration state of the energy storage device based on a distribution of the voltage values included in the data items the charge amounts of which belong to a first charge-amount range when it is detected that a distribution of first charge/discharge command values satisfies a predetermined condition, the first charge/discharge command values being the charge/discharge command values at which the data items the charge amounts of which belong to the first charge-amount range is obtained.

Hereinafter, an embodiment of the present invention will be explained with reference to drawings.

Figure 1:
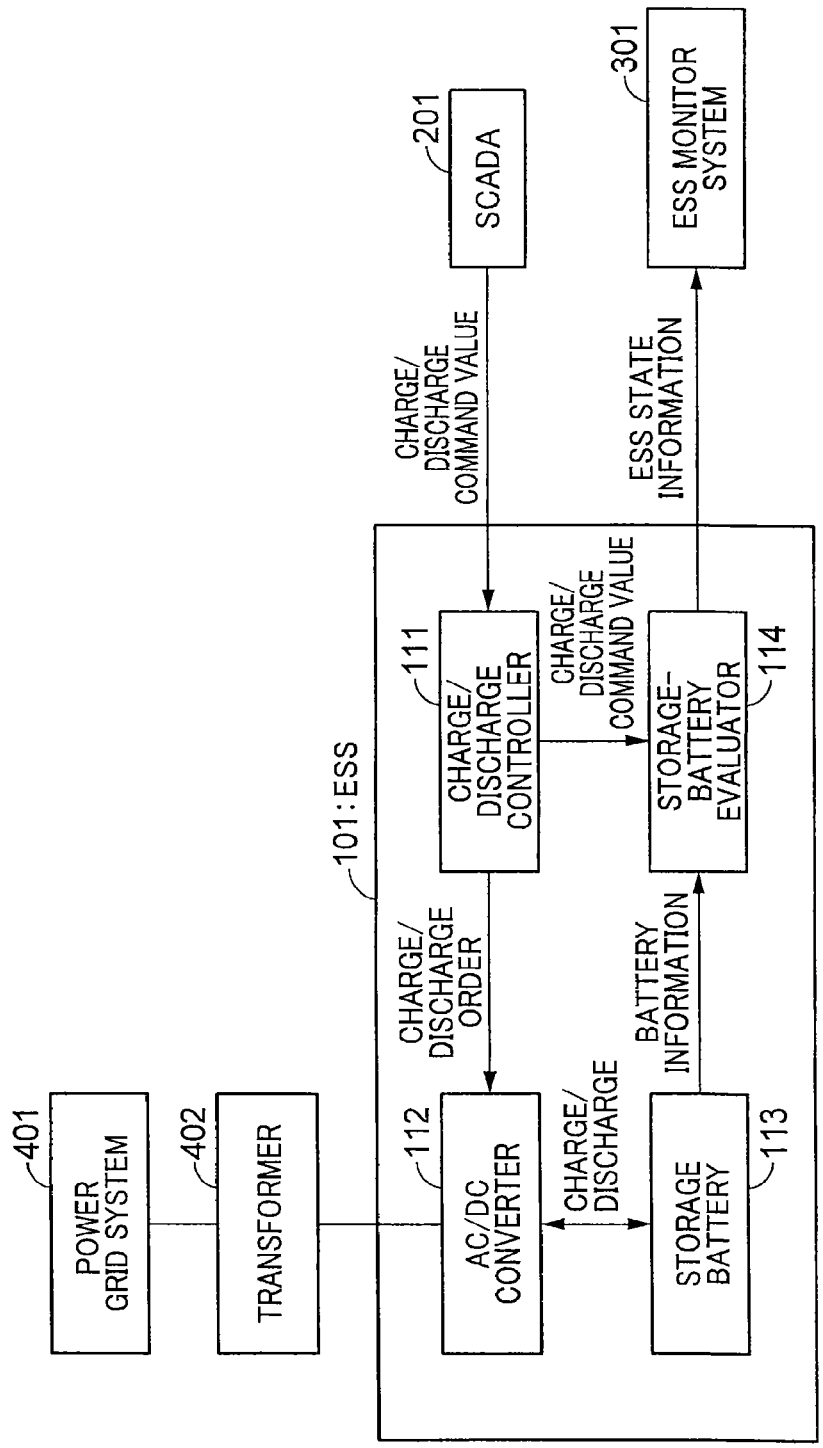
FIG. 1 is a drawing showing an energy storage system according to an embodiment of the present invention.

FIG. 1 shows an energy storage system (ESS: Energy Storage System) 101 according to the embodiment of the present invention. The energy storage system 101 is provided with: a charge/discharge controller 111, an AC/DC converter 112, a storage battery 113, and a storage-battery evaluator 114 corresponding to an energy-storage evaluation device according to the present embodiment. The energy storage system 101 has a function to carry out charge/discharge with respect to a power grid system in response to charge/discharge command values (electric-power command values) from a SCADA 201 and has a function to evaluate deterioration of the storage battery 113 and notifies ESS state information, which shows the state of the storage battery 113, to an ESS monitor system 301. Hereinafter, the energy storage system 101 will be explained in further detail.

The energy storage system 101 is connected to a power grid system 401 via a transformer 402. The transformer 402 converts the voltage of the electric power transmitted from the power grid system 401, and the converted electric power is supplied to the energy storage system 101. Moreover, the transformer 402 converts the electric power, which is discharged from the energy storage system 101, to a voltage for the system 401 and supplies the converted electric power to the system 401.

The energy storage system 101 is connected to the SCADA 201 via a communication network. The SCADA 201 (Supervisory Control And Data Acquisition) assumes various energy storage systems (ESSs) 101 present in an area as a single large ESS and transmits charge/discharge command values (electric-power command values), which are indicating charge/discharge electric power depending on time, to the individual ESSs. By virtue of them, the charge/discharge of the individual ESSs with respect to the power grid system 401 is controlled. The charge/discharge command value includes both of a command value of charge and a command value of discharge or at least one of them. The energy storage system 101 in FIG. 1 corresponds to one of the various ESSs present in the area. The SCADA 201 controls charge/discharge of the individual ESS based on, for example, a command from a higher-level energy management system, such as control center of an electric power company, a command from an individual energy management system (Energy Management System) of an electricity distribution side, or both of them.

The energy storage system 101 is connected to the ESS monitor system 301 via a (the) communication network. The ESS monitor system 301 monitors the energy storage system 101 based on the ESS state information provided from the energy storage system 101. The ESS monitor system 301 is provided with a monitor, generates screen data based on monitoring, and displays that by the monitor. A monitor operator perceives the state of the ESS by checking a screen displayed on the monitor. The ESS monitor system 301 may control operation of the ESS in response to monitor results of the ESS or in response to commands of the monitor operator.

The communication network mutually connecting the energy storage system 101 and the ESS monitor system 301 and the communication network mutually connecting the SCADA 201 and the energy storage system 101 may be the same or different from each other. The communication network may be a wireless network, a wired network, or a mixture thereof. Communications protocol may be the protocol which is uniquely determined for the SCADA 201 or the ESS, may be general-purpose protocol, or may be protocol based on that.

The charge/discharge controller 111 of the energy storage system 101 sequentially receives the charge/discharge command values from the SCADA 201 and, based on the charge/discharge command values, generates charge or discharge orders (charge/discharge orders), which can be interpreted by the AC/DC converter. The charge/discharge controller 111 transmits the generated charge/discharge orders to the AC/DC converter 112. If the AC/DC converter can interpret the charge/discharge command values without change, the charge/discharge command values may be transmitted without change. Moreover the charge/discharge controller 111 transmits the received charge/discharge command values to the storage-battery evaluator 114. In this process, the charge/discharge command values may be converted to a format that can be interpreted by the storage-battery evaluator 114 and transmitted.

The AC/DC converter 112 has a function to bidirectionally convert AC electric power of the side of the system 401 and DC electric power of the side of the storage battery 113. The AC/DC converter 112 may include a single AC/DC converter or arbitrarily connected converters of two or more types among an AC/DC converter, a DC/DC converter, and an AC/AC converter. For example, an AC/DC converter and a DC/DC converter may be directly connected, an AC/AC converter and an AC/DC converter may be directly connected, or an AC/AC converter, an AC/DC converter, and a DC/DC converter may be connected in series in this order. The AC/DC converter 112 executes charge/discharge with respect to the storage battery 113 in response to the charge/discharge orders from the charge/discharge controller 111.

The storage battery 113 is a storage battery which can accumulate (charge) and discharge electric energy. The storage battery 113 is provided with, for example, one or more battery board(s). As an example, each battery board is provided with one or more battery module(s) and one BMU (Battery Management Unit: battery monitor). Each battery module is provided with a plurality of unit batteries (cells). Each battery module may be provided with one CMU (Cell Monitoring Unit: cell monitor). The numbers of the battery modules provided in the battery boards may be mutually the same or different. The numbers of the cells provided in the battery modules may be mutually the same or different. The BMU and the CMU respectively provided in the battery board and the battery module are single, but may be plural. The storage battery 113 discharges the electric power, which is accumulated in the cells, to the AC/DC converter 112 in response to a discharge instruction from the AC/DC converter 112 and charges the cells with the electric power, which is supplied from the system 401 via the AC/DC converter 112, in response to a charge instruction. Each of the cells, the battery modules, the battery boards, and the storage battery is a mode of an energy storage device, which accumulates electric energy therein.

Figure 2:
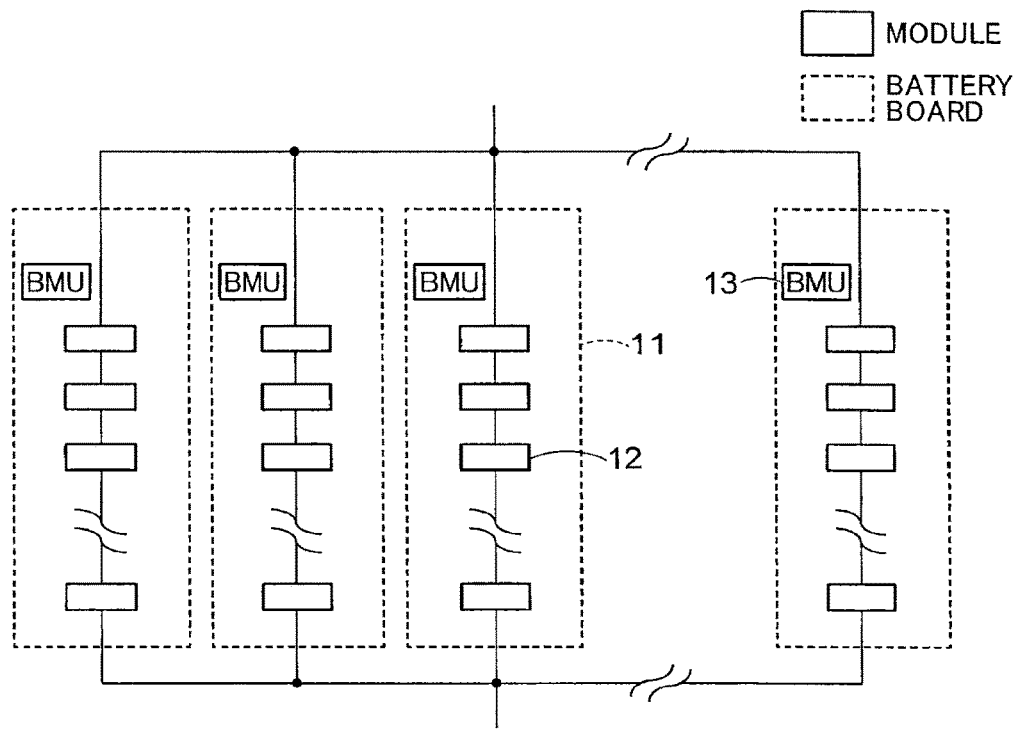
FIG. 2 is a drawing showing a configuration example of a storage battery.

FIG. 2 is a drawing showing a configuration example of the storage battery. A plurality of battery boards 11 are connected in parallel to form a battery array. On each of the battery boards 11, a plurality of battery modules 12 are connected in series. Each of the battery boards 11 is provided with a BMU 13. The configuration shown in FIG. 2 is an example, and the plurality of battery modules 12 may be connected in parallel, or the plurality of battery modules 12 may be connected in series parallel. Also, the plurality of battery boards may be connected in series or in series parallel. The BMU 13 may be provided with a communicator which transmits/receives information to/from the storage-battery evaluator 114. The communicator may be disposed inside or outside the battery board 11 as a function which is independent from the BMU 13.

Figure 3:
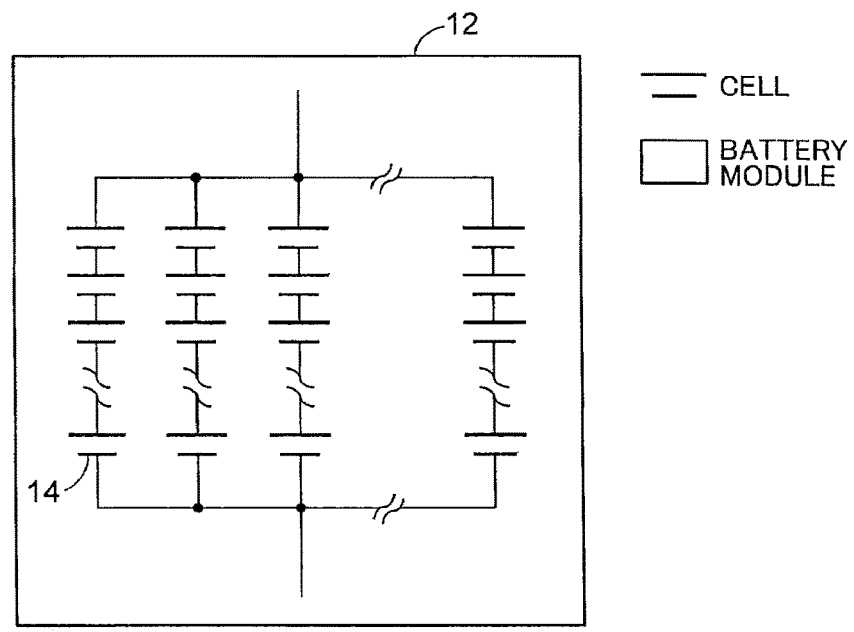
FIG. 3 is a drawing showing an example of the configuration of the battery module.

FIG. 3 is a drawing showing an example of the configuration of the battery module 12. The battery module 12 is provided with a configuration in which a plurality of cells 14 are connected in series parallel. The configuration shown in FIG. 3 is an example, and other configurations can be also used. For example, a mode in which the plurality of cells 14 are connected only in series or a mode in which they are connected only in parallel is also possible. In the example of FIG. 3, the battery module 12 may be provided with a CMU. The cells 14 are chargeable/dischargeable secondary batteries. Examples thereof include lithium-ion batteries, lithium-ion polymer batteries, lead storage batteries, nickel-cadmium batteries, and nickel-hydrogen batteries.

A measure (not shown) which measures parameters such as a voltage, a current, and a temperature is disposed for each of the cells. Similarly, a measure (not shown) which measures parameters such as the voltage, current, and temperature of the battery module is disposed for each of the battery modules 12.

Moreover, a measure (not shown) which measures parameters such as the voltage, current, and temperature of the battery board is disposed for each of the battery boards. Moreover, a measure (not shown) which measures parameters such as the voltage, current, and temperature of the storage battery 113 is disposed for the battery array (storage battery 113). Herein, the measures which measure voltages, currents, and temperatures are disposed for all the types of the energy storage devices, i.e., the cells, the battery modules, the battery boards, and the storage battery 113; however, the measure(s) may be disposed only for part of the types thereof. Moreover, in the case of the cells, the measures may be disposed only for part of the cells instead of all of the cells, and this is similar also for the energy storage devices (battery modules, battery boards) of other types. Moreover, the measures may measure other parameters such as humidity other than the voltage, current, and temperature.

The storage battery 113 transmits battery information about the energy storage device (for example, one cell, one battery module, one battery board, or the storage battery) serving as an evaluation target to the storage-battery evaluator 114. The battery information includes the parameters (for example, the voltage, current, temperature) measured by the measure.

The storage battery 113 may include a standby cell, a standby battery module, or a standby battery board. In that case, if a malfunctioning cell, a malfunctioning battery module, or a malfunctioning battery board occurs, the malfunctioning cell, the malfunctioning battery module, or the malfunctioning battery board may be configured to be switched to the backup cell, the backup battery module, or the backup malfunctioning board.

The storage-battery evaluator 114 evaluates the deterioration state of the energy storage device serving as an evaluation target based on the battery information on the energy storage device, which is serving as the evaluation target, received from the storage battery 113 and the charge/discharge command values received from the charge/discharge controller 111. The storage-battery evaluator 114 transmits the ESS state information including the deterioration state of the energy storage device serving as the evaluation target to the ESS monitor system 301.

Figure 4:
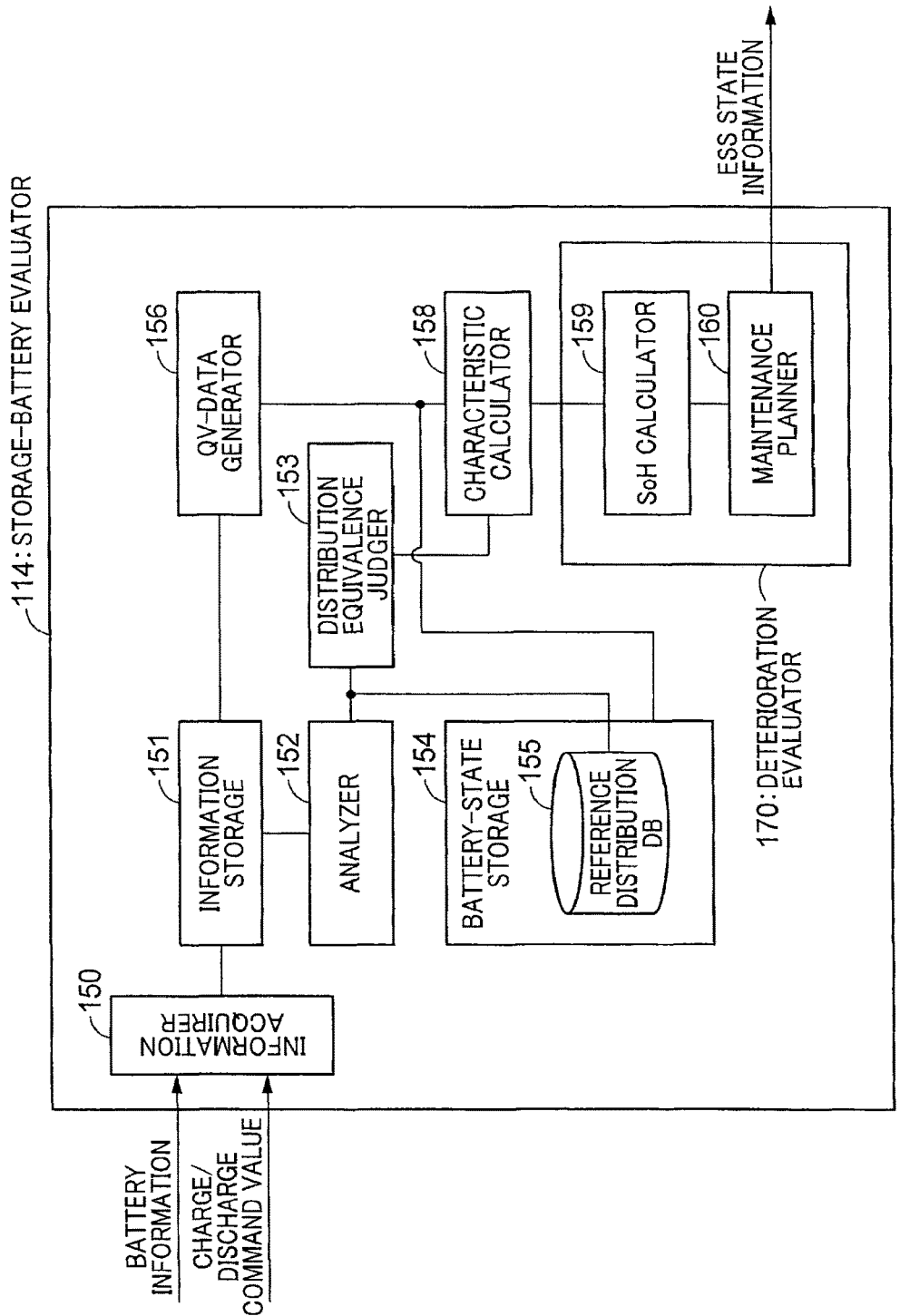
FIG. 4 is a block diagram showing a configuration of a storage-battery evaluator.

FIG. 4 is a block diagram showing a configuration of the storage-battery evaluator 114. The storage-battery evaluator 114 is provided with an information acquirer 150, an Information storage 151, an analyzer 152, a distribution equivalence judger (Judger) 153, a battery-state storage 154, a QV data generator (data generator) 156, a characteristic calculator 158, and a deterioration evaluator 170. The deterioration evaluator 170 is provided with a SoH calculator 159 and a maintenance planner 160. The battery-state storage 154 is provided with a reference-distribution database (DB) 155.

The Information acquirer 150 is electrically connected to the storage battery 113 and receives the battery information (for example, current, voltage, temperature) of the energy storage device, which is serving as the evaluation target, from the storage battery 113. The Information storage 151 stores therein the battery information acquired by the information acquirer 150. Time information may be added to the battery information, and the battery information may be stored in time series based on the time information. Alternatively, time information may be acquired from a clock which counts time, and the received battery information may be stored in association with the time information.

Moreover, the information acquirer 150 acquires the charge/discharge command values from the charge/discharge controller 111. The information storage 151 stores therein the charge/discharge command values acquired by the information acquirer 150. Time information may be added to the charge/discharge command values, and the charge/discharge command values may be stored in time series based on the time information. Alternatively, time information may be acquired from a clock which counts time, and the received charge/discharge command values may be stored in association with the time information.

Figure 5A:
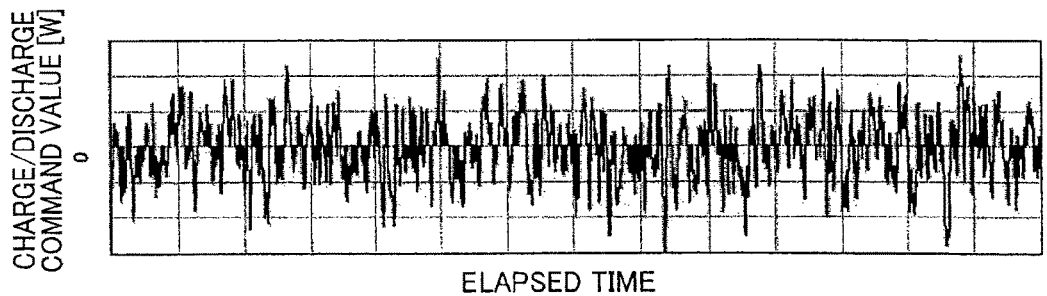
FIGS. 5A to 5C are drawings showing graph examples of charge/discharge command value data, voltage data, and current data.

FIG. 5A shows a graph of data which is the charge/discharge command values disposed in accordance with elapsed time (charge/discharge command value data). The values larger than "0" are the discharge command values, and the values smaller than "0" are the charge command values.

Figure 5B:
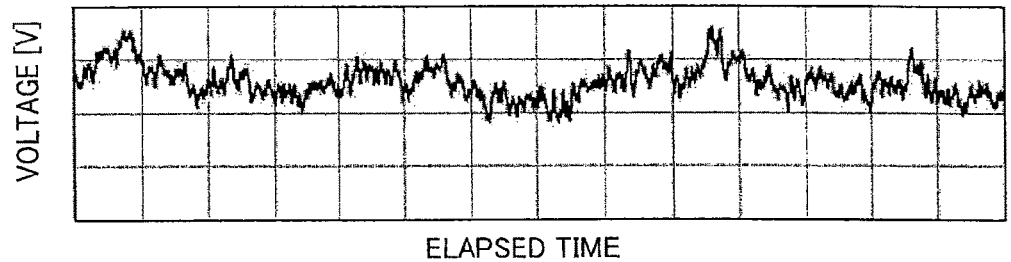

FIG. 5B shows a graph of data in which voltage values, which are shown in the battery information, are disposed in accordance with time elapse (voltage data).

Figure 5C:
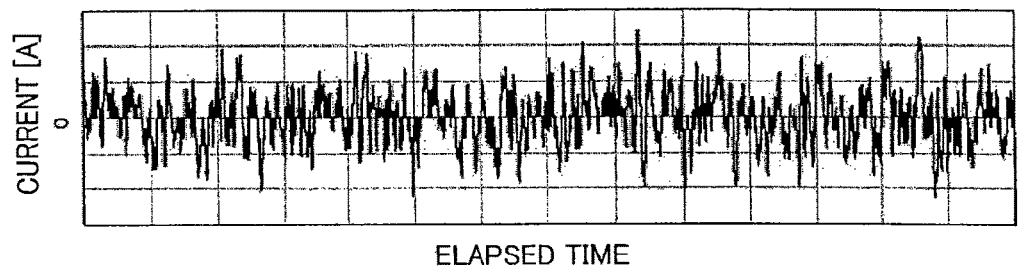

FIG. 5C shows a graph of data in which current values, which are shown in the battery information, are disposed in accordance with time elapse (current data). The values larger than "0" represent discharge currents, and the values smaller than "0" represent charge currents.

Figure 6A:
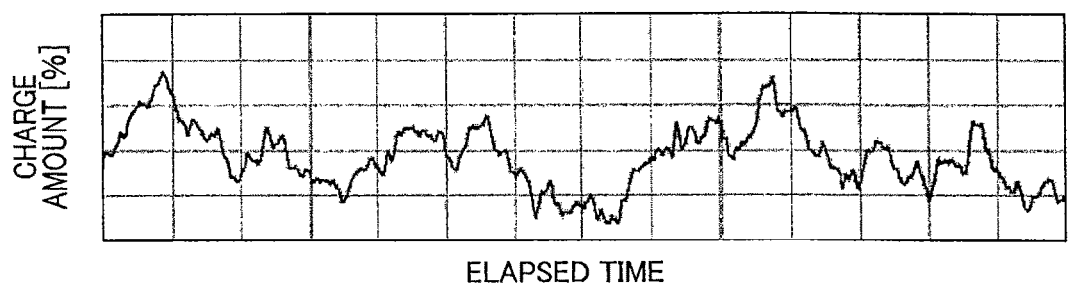
FIGS. 6A and 6B are drawings showing graph examples of charge amount data and temperature data.

FIG. 6A shows a graph of charge amount data in which the charge amounts of the energy storage device are disposed in accordance with time elapse. Herein, the charge amounts are expressed by SOC (State Of Charge). The unit of SOC is "%". Note that it may be arbitrarily determined, for example, the case in which the charge amount is "0" may be expressed as "0%", the prescribed charge amount may be expressed as "100%", and a lower limit and an upper limit of a range determined in advance may be expressed as "0%" and "100%". This graph is obtained by accumulating (integrating) the currents charged or discharged from the charge amount at the point of charge/discharge start (the charge amount of initial state). If the battery information output by the storage battery 113 includes the information about the charge amount, the graph of SOC may be acquired by using this information.

Figure 6B:
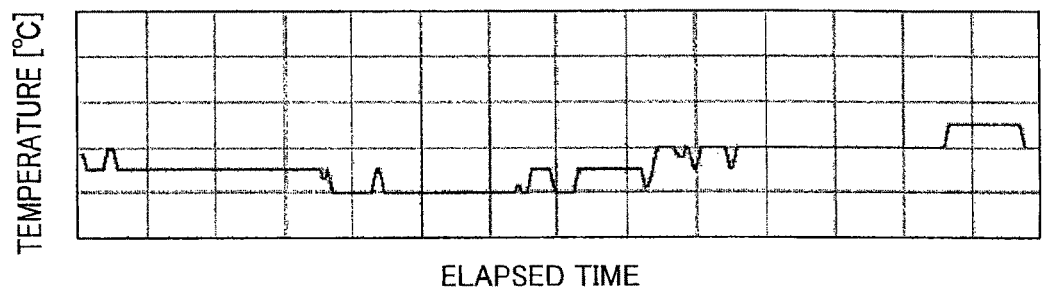

FIG. 6B shows a graph of temperature data showing the temperatures of the energy storage device in accordance with time elapse. Instead of the temperatures, averages of the temperatures from the point of charge/discharge start or average values of the temperatures until the point of a certain period of time before may be used.

Regarding items other than those shown in FIGS. 5A to 5C and FIGS. 6A and 6B, if the item(s) is present in the battery information or if the item(s) can be calculated from the plurality of Items included in the battery information, the data in which the values of the item are disposed in accordance with time elapse can be obtained also for the item.

Figure 7A:
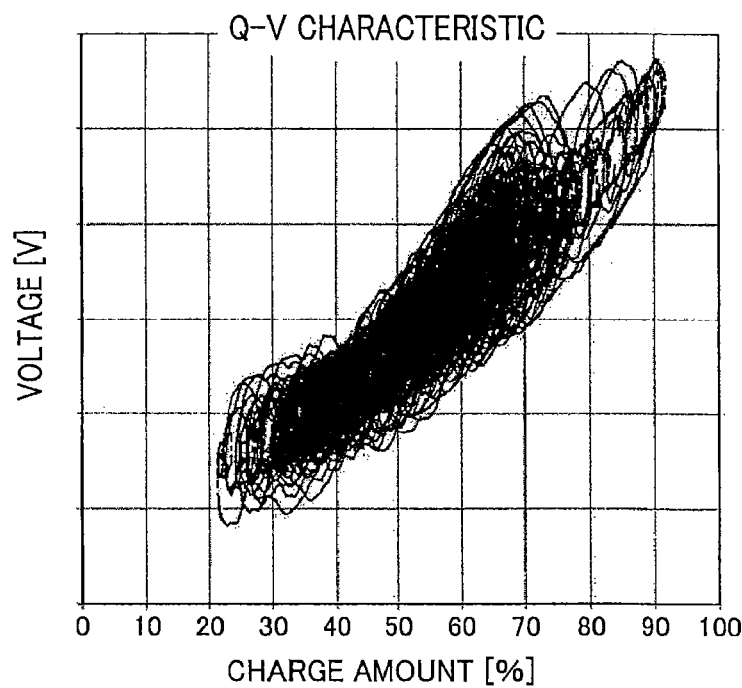
FIGS. 7A and 7B are drawings showing examples of QV data.
Figure 7B:
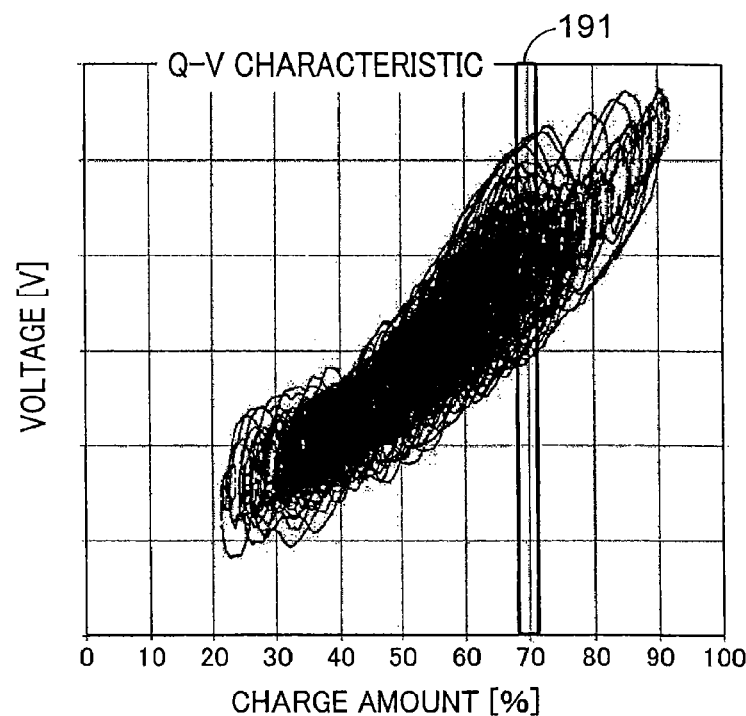

The QV data generator 156 generates QV data, which consists of the data of a plurality of correspondence data items on the charge amounts and the voltages, based on the information stored in the information storage 151. The relation between the charge amounts and the voltages are sometimes referred to as Q-V characteristics. The QV data is obtained, for example, by generating the charge amount data of FIG. 6A from the current data of FIG. 5C and generating the data of a plurality of correspondence data items in which the charge amounts and the voltages are associated by one-to-one from the charge amount data and the voltage data of FIG. 5B. FIG. 7A shows a QV data example in which the charge amounts (Q) and the voltages (V) of the data of the plurality of correspondence data items are plotted in a coordinate system respectively using them as axes. The charge amounts are expressed by SOC (%). FIG. 7B shows a predetermined charge-amount range (evaluation range) 191. In this example, the predetermined charge-amount range is a range larger than 69 and less than 70. As described later in detail, in the present embodiment, evaluating the deterioration state of the energy storage device based on variations in the voltages of the predetermined charge-amount range 191 is one characteristic.

The analyzer 152 specifies the charge/discharge command values which belong to the predetermined charge-amount range among the charge/discharge command values stored in the Information storage 151 and generates a command-value distribution (target command-value distribution) expressing the relations between the specified charge/discharge command values and frequencies. The charge/discharge command values which belong to the predetermined charge/discharge amount range are the charge/discharge command values with which the correspondence data items including the charge amounts belonging to the predetermined charge-amount range is obtained by charge/discharge control. In other words, among the charge/discharge command values, they are the charge/discharge command values, wherein execution thereof causes the charge amount of the energy storage device calculated by accumulating the measured current values to be present in the predetermined charge-amount range.

Figure 8A:
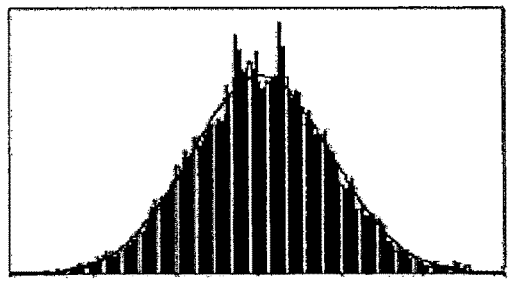
FIGS. 8A and 8B are drawings showing examples of a target command-value distribution and a reference command-value distribution.
Figure 8B:
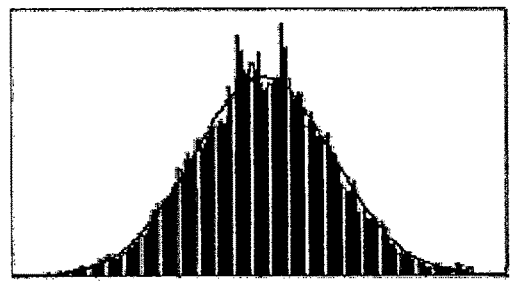

FIG. 8B shows an example of the target command-value distribution (distribution of command-value samples). The horizontal axis represents the command values, and the vertical axis represents the frequency (number of times). As an example, the command values of the values larger than "0" are discharge instructions, and the command values of the values smaller than "0" are charge instructions. A curve in the drawing is a normal distribution approximating this histogram, and this histogram can be said to have normality.

Moreover, the analyzer 152 calculates statistical information such as an average and standard deviation based on the target command-value distribution. FIG. 8B also shows an example of statistical information calculated from the target command-value distribution of FIG. 8B. Herein, an average μB, standard deviation σB, and a data number nB are shown.

The battery-state storage 154 is storing the reference-distribution database 155. The reference-distribution database 155 includes a reference command-value distribution (reference distribution), which shows relations serving as references of the charge/discharge command values and frequencies, and statistical information on the reference command-value distribution. FIG. 9A shows an example of the reference command-value distribution included in the reference-distribution database 155 and statistical information thereof. Herein, as an example of the statistical information, an average μA, standard deviation σA, and a data number nA are shown.

The distribution equivalence judger 153 judges whether the target command-value distribution calculated by the analyzer 152 satisfies a condition (predetermined condition) about the frequency of the charge/discharge command values or not. This case shows an example in which, whether the target command-value distribution is equivalent to the reference command-value distribution, which is included in the reference-distribution database 155, or not is judged, and it is judged that the condition is satisfied if it is equivalent and that the condition is not satisfied if it is not equivalent.

As an example of a method of judging the equivalence between the two distributions, a two-sample t-test (parametric method) can be used. In this method, normality of each of the target command-value distribution and the reference command-value distribution is confirmed, and, after homoscedasticity between them is confirmed, a null hypothesis that there is no difference between the distributions is formed. A normality test such as Anderson-Darling test can be used for confirming the normality. A homoscedasticity test such as F test can be used for confirming the homoscedasticity. An average value "$\overline{X}_1$" and standard deviation "$\hat{\sigma}_1$" of the reference command-value distribution and an average value "$\overline{X}_2$" and standard deviation "$\hat{\sigma}_2$" of the target command-value distribution of this time are obtained, and a value "$t_0$" is obtained by a below equation. "$n_1$" is a sample number about the reference command-value distribution, and "$n_2$" is a sample number about the target command-value distribution of this time.

$$t_0 = \frac{\overline{X}_1 - \overline{X}_2}{\sqrt{\frac{\hat{\sigma}_1^2}{n_1} + \frac{\hat{\sigma}_2^2}{n_2}}} \qquad \text{Equation (1)}$$

The value "t0" is known to follow a "t" distribution of a freedom degree "$\phi$". The freedom degree "$\phi$" is obtained in accordance with a below definition.

$$\phi = \frac{\left(\frac{\hat{\sigma}_1^2}{n_1} + \frac{\hat{\sigma}_2^2}{n_2}\right)^2}{\frac{\hat{\sigma}_1^2}{n_1^2(n_1-1)} + \frac{\hat{\sigma}_2^2}{n_2^2(n_2-1)}} \qquad \text{Equation (2)}$$

A critical value of the value "t" (described as "t($\phi$; α)") is acquired by a "t" distribution table according to a risk rate α and the freedom degree "$\phi$". Generally, in a case of "t0≤t($\phi$; α)", if the risk rate "α" is 5%, absence of a significant difference between the average values of both of the distributions cannot be denied, in other words, the significant difference is not observed. In this case, both of the distributions can be assumed to be equivalent. Reversely, if "t0>t($\phi$; α)", it is assumed that there is a difference between both of the distributions.

If it is judged by the distribution equivalence judger 153 that both of the distributions are equivalent, the characteristic calculator 158 obtains the distribution of the voltage values of the correspondence data items (Q, V) belonging to the predetermined charge-amount range (evaluation range) from the QV data generated by the QV data generator 156. Specifically, the characteristic calculator 158 specifies the correspondence data items (Q, V) belonging to the predetermined charge-amount range (evaluation range). FIG. 7B shows an example of specifying the correspondence data items belonging to the range in a case in which the predetermined charge-amount range 191 is a range larger than 69 and smaller than 71 (69<Q<71). Then, from the specified correspondence data items, a voltage distribution (V distribution) showing the relation between the voltage values and frequencies is generated. For example, a histogram having the voltages [V] as a horizontal axis and having the frequencies (number of times) as a vertical axis is generated. Moreover, the characteristic calculator 158 calculates statistical information such as the average and standard deviation of the voltage distribution.

Figure 9:
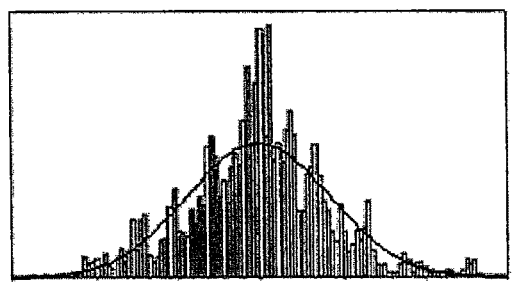
FIG. 9 is a drawing showing an example of a voltage distribution and statistical information thereof.

FIG. 9 shows an example of the V distribution, which is generated from the voltage values of the correspondence data items belonging to the range 191 (see FIG. 7B) in the QV data, and the statistical information thereof. A curve in the drawing is a normal distribution approximating this histogram, and this voltage distribution can be said to have normality. In the right of the drawing, calculation examples of the statistical information are shown. For example, an average is $V\mu$, standard deviation is $V\sigma$, and a sample number (data number) is nV.

The characteristic calculator 158 calculates a characteristic of the energy storage device based on the voltage distribution (distribution of the voltage values) or the statistical information calculated therefrom. The characteristic may be anything as long as it is a value that expresses variations in the voltages (degree of changes), and an example thereof is standard deviation or variance of the voltage distribution. Alternatively, as long as it is a value based on the standard deviation or variance, another value may be used.

In the above described explanation, the voltage distribution and the characteristic are calculated if the distribution equivalence judger 153 judges that the target command-value distribution is equivalent to the reference command-value distribution; however, different from judgement of equivalence between both of the distributions, the voltage distribution and the characteristic may be calculated in parallel (simultaneously), and, if both of the distributions are judged to be equivalent, a characteristic at that point may be employed.

Also, in the above described example, the condition about the frequency of the charge/discharge command values is assumed to be satisfied if the target command-value distribution is equivalent to the reference command-value distribution; however, another method may be used. For example, a simplified method in which, for example, the predetermined condition is satisfied if the average and standard deviation of the target command-value distribution are included in ranges determined in advance may be used. The ranges determined in advance may be determined based on, for example, the average and standard deviation of the reference command-value distribution.

The SoH calculator 159 evaluates a deterioration state (or SoH: State of health) of the energy storage device based on the characteristic calculated by the characteristic calculator 158 and deterioration-state evaluation data. The deterioration-state evaluation data is data in which a deterioration-state value and the characteristic are associated. The deterioration state may be anything as long as it represents the deterioration degree of the energy storage device, and, for example, a ratio of a current volume to an initial volume (current volume/initial volume) can be used. Alternatively, the value of Internal resistance or a value of a different type may be used.

Figure 10:
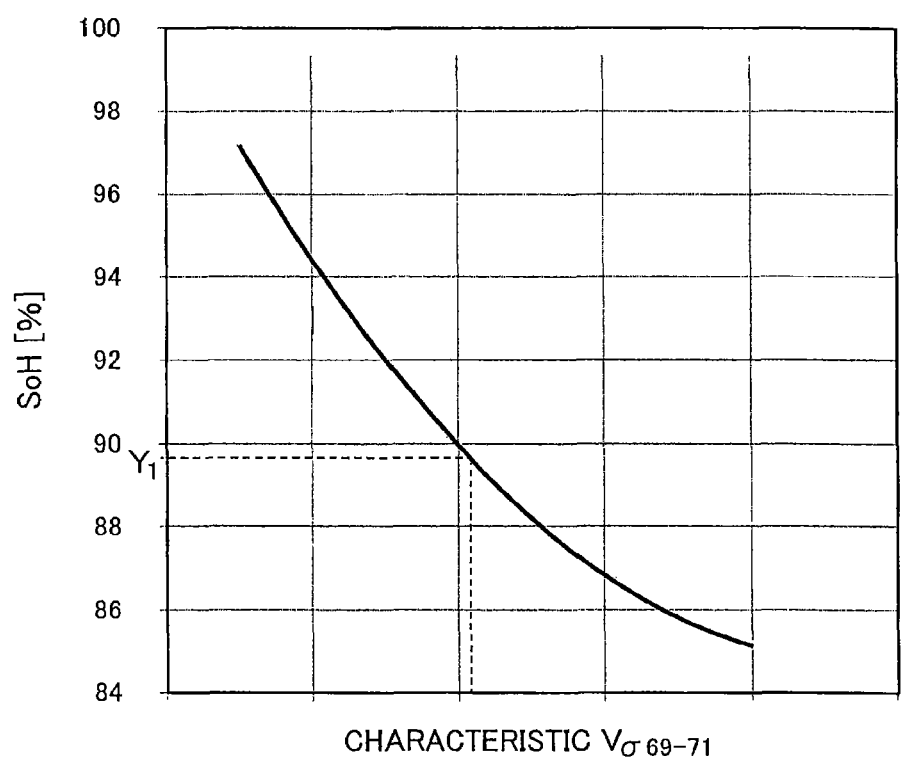
FIG. 10 is a drawing showing an example of deterioration-state evaluation data.

The SoH calculator 159 specifies the deterioration-state value corresponding to the calculated characteristic in the deterioration-state evaluation data and determines the deterioration state of the energy storage device based on the specified deterioration-state value. FIG. 10 shows an example of the deterioration-state evaluation data. The deterioration-state evaluation data is a function "$Y=f(V\sigma 69\text{-}71)$" which associates the characteristic and SoH (herein, the current volume/the Initial volume displayed by percentage). "$V\sigma 69\text{-}71$" represents the standard deviation of the voltages in the case in which the predetermined charge-amount range is larger than 69 and less than 71. The output "Y" of the function represents a SoH value. In the present example, as shown in FIG. 9, since the standard deviation is "$V\sigma$", the deterioration-state value is calculated as "Y1" according to "$V=f(V\sigma)$".

Herein, reasons why the deterioration state can be evaluated from the characteristic (standard deviation in the above described example) about variations in the voltage values of the correspondence data items belonging to the predetermined charge-amount range (evaluation range) will be explained. The current input or output to or from the energy storage device is different depending on the charge/discharge command value to be executed, and the Internal resistance of the energy storage device (for example, the battery cell, the battery module, the battery board, or the storage battery) is changed depending on the current of Input or output. Therefore, as is understood from FIG. 7A mentioned above, the relation between the charge amounts and the voltages does not become constant (the relation between the charge amounts and the voltages does not become a linear line). Moreover, a charge-amount range in which the variations in the voltages notably appear in the relation (QV characteristics) between the charge amounts and the voltages depending on the type (for example, model number or material) and the deterioration state (SoH) of the energy storage device is present. Furthermore, even in that range, the measured voltage is changed depending on the current input or output (depending on the charge/discharge command value to be executed) or depending on the charge amount.

Therefore, in advance, in energy storage devices (energy storage devices of the same type) in a plurality of deterioration states, for example, charge/discharge is carried out by using the charge/discharge command values having the same pattern, and QV data is acquired. In this process, conditions such as initial charge amounts of the energy storage devices may be the same. Then, the charge-amount range in which variations in the voltage are largely changed in the QV data depending on the deterioration state is commonly specified for the deterioration states. Herein, when the charge-amount range is specified in a narrow range, in a case in which equivalence with the target command-value distribution is to be judged in accordance with the above described present embodiment, differences in the charge amounts upon execution of the charge/discharge command values in the charge-amount range can be absorbed. Then, deterioration evaluation data in which the characteristic (for example, standard deviation) representing variations in the voltages in the charge-amount range and the deterioration-state value are associated is created, and a reference command-value distribution is generated based on the charge/discharge commands belonging to this charge-amount range. By assuming that the charge/discharge commands belonging to the charge-amount range in each deterioration state are the same (or equivalent), the distribution of the charge/discharge commands belonging to the charge-amount range corresponding to any one of the deterioration states may be employed as a reference command-value distribution. Note that deterioration evaluation data and a reference-value command-value distribution may be similarly generated by separately preparing and executing charge/discharge command values that the frequencies of the charge/discharge command values are the same (or equivalent) in the specified charge-amount range and measuring the energy storage device in each deterioration state.

By using the deterioration evaluation data generated in this manner, in a case in which the charge/discharge command values of which command-value distribution in the predetermined charge-amount range are equivalent to the reference command-value distribution are given, the deterioration state of the energy storage device can be evaluated by the above described process.

Based on the deterioration state of the energy storage device calculated by the SoH calculator 159, the information stored in the information storage 151 and the battery-state storage 154, or both of them, the maintenance planner 160 generates ESS state information about the state of the energy storage device. The maintenance planner 160 transmits the ESS state information to the ESS monitor system 301 via the communication network.

As an example of the ESS state information, the maintenance planner 160 may transmit information about workability of the energy storage device. Specifically, the maintenance planner 160 judges the workability of the storage battery 113 based on the SoH of the energy storage device. For example, the range of the SoH is separated into three by using a threshold value "A" and a threshold value "B", and a range 1 equal to or lower than the threshold value "A", a range 2 larger than the threshold value "A" and equal to or less than the threshold value "B", and a range 3 equal to or more than the threshold value "B" are obtained. If the SoH of the energy storage device belongs to the range 1, it is judged that the storage battery 113 cannot work any further (in other words, the storage battery 113 reached end of life), and a message of a failure alert may be notified to the ESS monitor system 301. If it belongs to the range 2, it is judged that the storage battery 113 is still workable but requires maintenance, and a message of a maintenance call may be notified to the ESS monitor system 301. If it belongs to the range 3, it is judged that the storage battery 113 is normal and is workable hereafter. In that case, a message that the storage battery 113 is normal (no failure, and maintenance has not yet been required) may be notified to the ESS monitor system 301, or such a notification is not particularly required.

The judgement method of workability described herein is an example, and a different judgement method may be used. For example, the workability may be judged by calculating a plurality of SoHs by a plurality of times of deterioration evaluation and using the average, median value, maximum value, or minimum value of these SoHs.

Moreover, for example, a state transition model that judges the workability according to transitions in the characteristic (or SoH) is generated, and the workability may be judged based on the state transition model and a plurality of characteristics (or a plurality of SoHs) calculated by a plurality of times of deterioration evaluation.

Alternatively, a model that judges a failure probability from the characteristic by, for example, logistic regression analysis is generated, a failure rate is calculated from the model and the calculated characteristic, and the workability may be judged from the value of the failure rate. As a matter of course, the workability can be judged by a method other than those shown as examples herein.

Other than the information about the workability, as the ESS state information, charge/discharge command-value data (electric-power command-value data), voltage data, current data, charge-amount data, and/or temperature data may be transmitted. Moreover, voltage distribution data (voltage histogram) showing the distribution of voltages in the above described predetermined charge-amount range or data of a normal distribution approximating the voltage distribution may be transmitted. Moreover, command-value distribution data showing the distribution of the charge/discharge command values belonging to the above described predetermined charge-amount range or data of a normal distribution approximating the command-value distribution may be transmitted. Moreover, the deterioration-state evaluation data used when the deterioration state is specified may be transmitted. Moreover, the information showing the deterioration state (SoH) measured this time may be transmitted. Moreover, the QV data may be transmitted. The data other than those described here may be transmitted.

The ESS monitor system 301 receives the ESS state information from the ESS 101 and, based on the ESS state information, displays a screen for an administrator to evaluate the state of the storage battery 113 (deterioration-state evaluation screen) by a display device. Moreover, if the ESS state information includes workability information, an operation corresponding to the workability information may be carried out. For example, if the workability information indicates that it is not workable, a message of a failure alert may be displayed by the screen. If it is workable but requires maintenance, a message of a maintenance call may be displayed by the screen. If the storage battery 113 is normal, a message that notifies normality of the storage battery 113 may be displayed by the screen. Other than display to the screen, a failure alert, a maintenance call, or a message sound that notifies normality of the storage battery 113 may be output via a speaker. Also, the work state of the ESS 101 may be notified by displaying (for example, lighting) a color on the screen, for example, red if it is not workable, yellow if it is workable but requires maintenance, and green if the storage battery 113 is normal.

Figure 11:
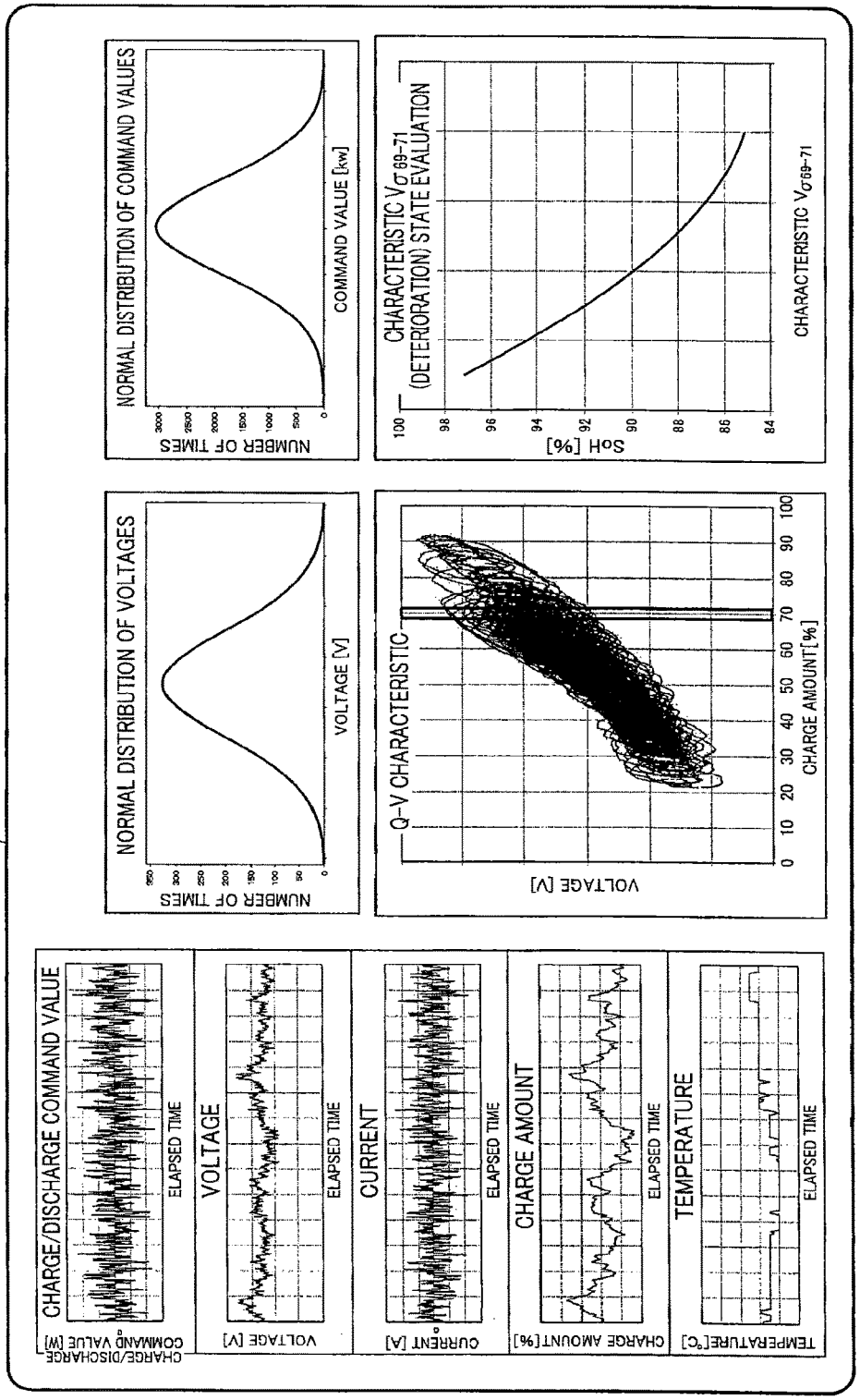
FIG. 11 is a drawing showing an example of a deterioration-state evaluation screen.
Figure 12:
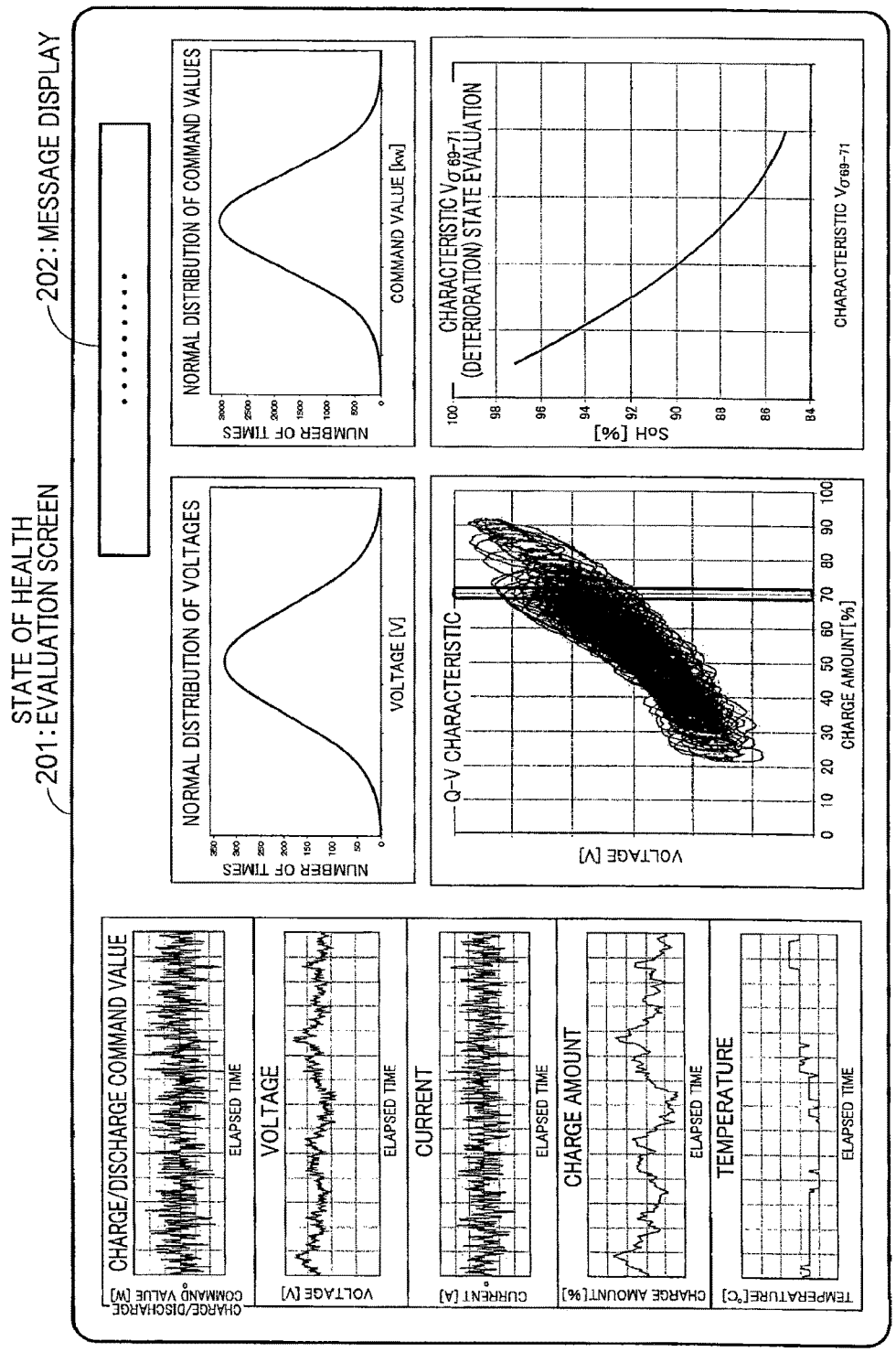
FIG. 12 is a drawing showing another example of the deterioration-state evaluation screen.

FIG. 11 shows an example of a deterioration-state evaluation screen displayed by the display device of the ESS monitor system 301. In the left side of the screen, charge/discharge command-value data (electric-power command-value data), voltage data, current data, charge-amount data, and temperature data is displayed in accordance with elapsed time. Moreover, at the center, the data of the normal distribution approximating the voltage distribution and the QV data is displayed. Moreover, in the right side, the data of the normal distribution approximating the distribution of the charge/discharge command values and the deterioration-state evaluation data is displayed. The administrator can monitor the state of the storage battery 113 by watching this screen. In the deterioration-state evaluation screen, a message display that displays various messages may be disposed. FIG. 12 shows an example of the deterioration-state evaluation screen provided with the message display. A message corresponding to the state of the storage battery 113 is displayed by the message display 202. For example, if it is judged that the storage battery 113 is not workable, a message of a failure alert such as "The storage battery 113 is malfunctioning" is displayed. " . . . " in the drawing expresses a state that an arbitrary message is displayed. Note that the message may be displayed by a different mode such as a pop-up display.

Herein, the characteristic calculator 158 may correct the characteristic (the standard deviation of the voltage distribution), which is calculated by the above described method, in accordance with the temperature of the energy storage device and use the corrected characteristic in the SoH calculator 159. As a result, the dependency of the voltage distribution with respect to the temperature can be taken into consideration, and more precise deterioration state estimation can be carried out. The correction can be carried out, for example, by a below equation.

$$FV = \alpha * EXP(1/T) * \sigma \qquad \text{Equation (3)}$$

FV: Corrected deterioration characteristic
α: Temperature coefficient
T: The temperature of the energy storage device (for example, the cell, the battery module, or the battery board)
σ: Standard deviation of the distribution of the voltages belonging to a certain charge-amount range (in other words, the characteristic before correction)

For the energy storage device in a certain deterioration state, for each of a plurality of temperatures, the characteristic (standard deviation of the voltage distribution) is calculated in the predetermined charge-amount range of a case in which charge/discharge is carried out by the charge/discharge command values of a particular pattern, and data showing the relation between the temperature and the characteristic (temperature-characteristic data) is obtained. A similar process is carried out also for the energy storage device in a different deterioration state, and the initial charge amounts of the energy storage devices may be the same in the processes. Then, based on the temperature-characteristic data with respect to the plurality of deterioration states, with respect to a temperature (reference temperature) serving as a certain reference, the temperature coefficient "α" which causes the characteristic in each deterioration state at a different temperature to match or approximate the characteristic in each deterioration state at the reference temperature is determined by using the form of the above described equation (3) as a restriction. The method of determination may be anything such as a least square method. As a result, the value of "α" can be determined for each of the other temperatures except for the reference temperature. Herein, "α" is determined for each of the other temperatures except for the reference temperature. However, a common value "α" may be determined for these other temperatures. Meanwhile, a function form other than EXP (1/T) may be used.

Figure 13:
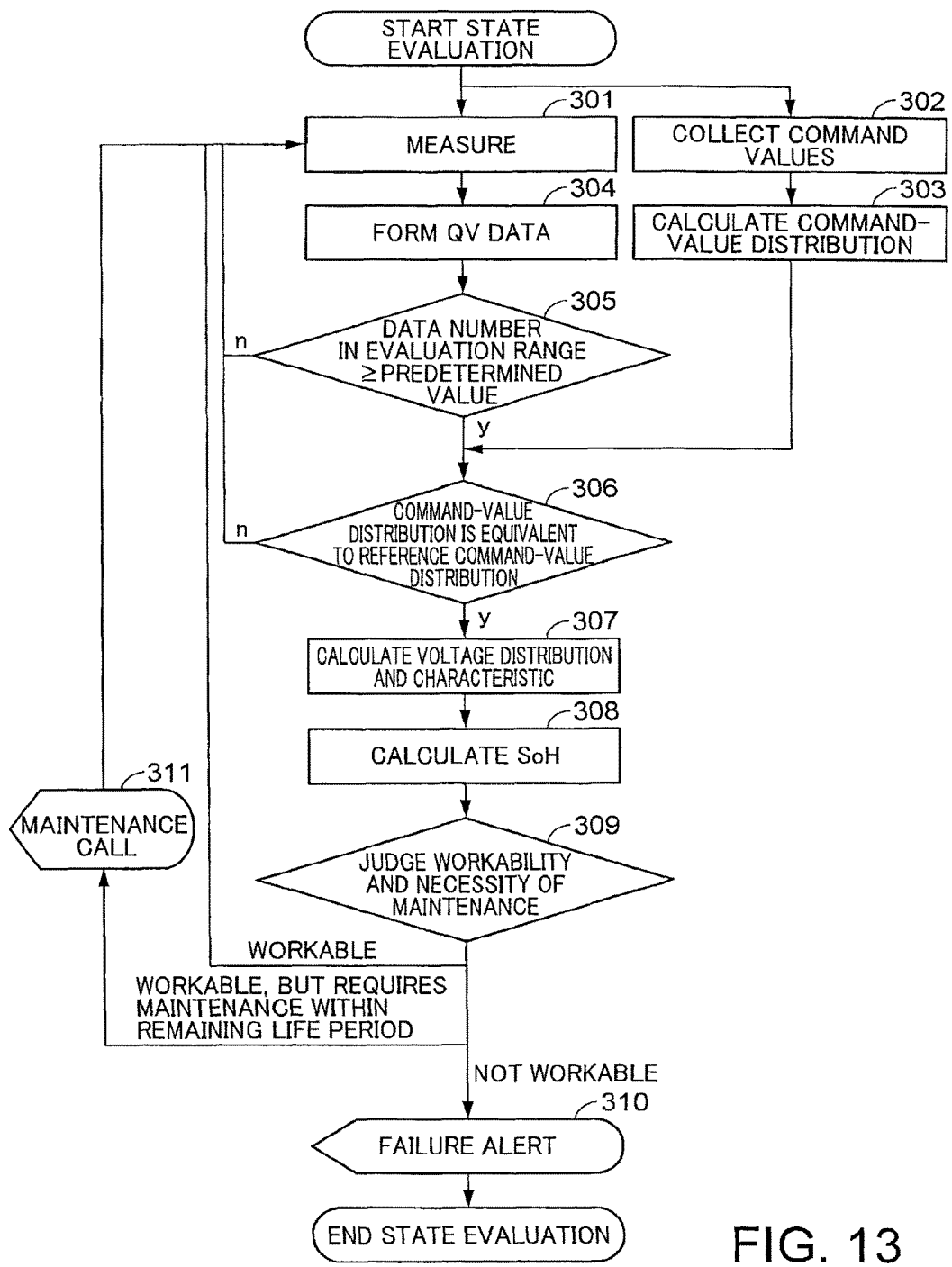
FIG. 13 is a drawing showing a flow chart of operations of an energy storage system according to the embodiment of the present invention.

FIG. 13 is a flow chart of operations of the energy storage system according to the embodiment of the present invention.

The energy storage system 101 starts a deterioration-state evaluation process of the energy storage device at an arbitrary timing. The charge/discharge command values received from the SCADA 201 are accumulated in the Information storage 151 of the storage-battery evaluator 114 (302), and the analyzer 152 generates a distribution (target command-value distribution) of the charge/discharge command values belonging to the predetermined charge-amount range (evaluation range) (S303). The target command-value distribution may be updated every time the charge/discharge command value belonging to the predetermined charge-amount range (evaluation range) is received, the distribution may be updated at every certain time, or the distribution may be generated at a time when the process proceeds to "YES" in later-described step 305.

On the other hand, the charge/discharge controller 111 of the energy storage system converts the charge/discharge command values, which are received from the SCADA 201, to charge/discharge orders for the AC/DC converter 112 and outputs them, and the AC/DC converter 112 causes the storage battery 113 to charge/discharge in accordance with the charge/discharge orders. The storage-battery evaluator 114 acquires battery information such as voltages, currents, and temperatures measured upon charge/discharge of the storage battery 113, and the acquired battery information is stored in the Information storage 151 (301). After the process is started, the QV data generator 156 generates QV data, which consists of data of a plurality of correspondence items on charge amounts and voltage values, based on the battery information stored in the information storage 151 (304), and the distribution equivalence judger 153 tests whether the correspondence data number (sample number) belonging to the predetermined charge-amount range is present by a predetermined value or more (S305). If the correspondence data number is less than the predetermined value, the process returns to step 301. If the correspondence data number is equal to or more than the predetermined value, the distribution equivalence judger 153 judges whether the target command-value distribution is equivalent to the reference command-value distribution. If both of them are not equivalent, the process returns to step 301. If both of them are equivalent, the characteristic calculator 158 generates a voltage distribution (V distribution), which is a distribution of the voltage values, from the voltage values of the correspondence data items in the above described predetermined charge-amount range and calculates a characteristic about variations in the voltage values from the voltage distribution (307). As the characteristic, for example, standard deviation or variance is calculated.

Based on the deterioration-state evaluation data provided in advance, the SoH calculator 159 calculates the deterioration state (SoH) from the characteristic calculated by the characteristic calculator 158 (308). In this process, the characteristic may be corrected according to the temperature of the energy storage device and above described equation (3), and the SoH may be calculated from the corrected characteristic and the deterioration-state evaluation data.

Based on the value of SoH, the maintenance planner 160 judges the work state of the energy storage device and, if it is in a workable state, returns to step 301. Alternatively, if a predetermined termination condition such as a case in which the time determined in advance has elapsed or a case in which a termination instruction is given from the administrator is satisfied, the process may be terminated. Meanwhile, if it is judged that, although the work state is in a workable state, maintenance is required within a remaining life period of the storage battery, a message of a maintenance call is transmitted to the ESS monitor system 301 (311), and the process returns to step 301. Alternatively, if the above described termination condition is satisfied, the process may be terminated. Meanwhile, if the work state is not workable, a message of a failure alert is transmitted to the ESS monitor system 310 (310), and the present process is terminated.

In the present embodiment, only one reference command-value distribution is prepared. However, when a plurality of reference command-value distributions and a plurality of pieces of state of health evaluation data are prepared, charge/discharge command values of various charge/discharge patterns can be supported. In that case, whether the target command-value distribution is equivalent to each of the plurality of reference command-value distributions is judged, and deterioration evaluation can be carried out by using the deterioration-state evaluation data corresponding to the reference command-value distribution judged to be equivalent.

Also, two or more predetermined charge-amount ranges may be set, and the reference command-value distribution and the deterioration-state evaluation data corresponding to each of the charge-amount ranges may be prepared. In this case, the above described process of the present embodiment may be carried out for each of the charge-amount ranges, and the above described process may be carried out based on the charge-amount range wherein the command-value distribution and the reference specified-value distribution are judged to be equivalent. If it is judged that both of the distributions are equivalent in the plurality of charge-amount ranges, the deterioration state (SoH) corresponding to any one of the charge-amount ranges may be employed, the deterioration state corresponding to the charge-amount range that is first judged that both of the distributions are equivalent may be employed, or the plurality of deterioration states may be comprehensively judged. For example, the average, median value, maximum value, minimum value, etc. of the plurality of SoHs may be employed, or a method other than that may be used. Alternatively, if a plurality of reference command-value distributions which are equivalent are present, for example, the reference command-value distribution which is the most equivalent (for example, that with largest "t0" in above described test) may be selected.

In the present embodiment, the target command-value distribution is a distribution of the charge/discharge command values (electric-power command values) belonging to the predetermined charge-amount range, but may be a distribution of first differential values (dP/dt) according to time of the charge/discharge command values as another mode. In that case, the reference command-value distribution is, for example, a distribution that shows a reference relation of the first differential and frequency according to the time of the charge/discharge command values; and, in accordance with needs, the charge/discharge command values of the explanations above are replaced by the first differential values with respect to the time of the charge/discharge command values, as a result, the process can be similarly carried out as before. As a result, equivalence of electric-power changes can be ensured.

Hereinabove, according to the embodiment of the present invention, in the energy storage system 101 (ESS), in which the currents (charge/discharge currents) input/output to/from the power grid system 401 are continuously variable like frequency variation suppression of the power grid system 401, the battery state of the energy storage system 101 can be evaluated while working the function as the ESS such as frequency variation suppression (without stopping the energy storage system 101).

Figure 14:
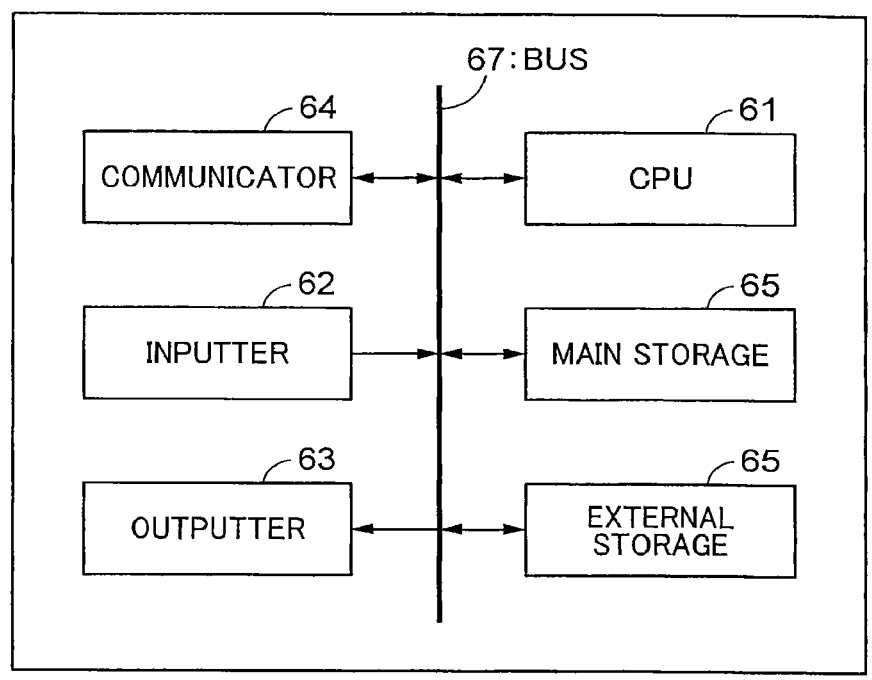
FIG. 14 is a drawing showing a hardware configuration example according to the embodiment of the present invention.

FIG. 14 shows a hardware configuration example of the storage-battery evaluator 114 and the charge/discharge controller 111 in the energy storage system according to the embodiment of the present invention. The hardware configuration of FIG. 14 is provided with a CPU 61, an inputter 62, a display 63, a communicator 64, a main storage 65, and an external storage 66, and these are mutually communicatably connected by a bus 67.

The inputter 62 acquires the battery information, which is measured at the storage battery 113, via wiring or the like. The outputter 63 outputs the charge/discharge orders to the AC/DC converter 112. The communicator 64 includes a wireless or wired communication device and communicates with the SCADA 201 and the ESS monitor system 301 by respective predetermined communication methods. The inputter 62, the outputter 63, and the communicator 64 may consist of circuits such as respective separate integrated circuits, or may consist of a circuit such as a single integrated circuit.

Examples of the external storage 66 include storage media such as HDDs, SSD, memory devices, CD-R, CD-RW, DVD-RAM, and DVD-R. The external storage 66 stores a program(s) for causing the functions of the storage-battery evaluator and the charge/discharge controller to be executed by the CPU 61, which is a processor. Moreover, the information storage 151 and the battery-state storage 154 are also included in the external storage 66. Herein, only one external storage 66 is shown. However, a plurality of external storages 66 may be present.

Under control by the CPU 61, the main storage 65 expands a control program(s), which is stored in the external storage 66, and stores the data required to execute the program, the data generated by execution of the program, etc. The main storage 65 includes, for example, an arbitrary memory or a storage such as volatile memory (DRAM, SRAM, etc.) or a non-volatile memory (NAND flash memory, MRAM, etc.). When the control program expanded in the main storage 65 is executed by the CPU 61, the functions of the storage-battery evaluator 114 and the charge/discharge controller 111 are executed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the Inventions. The accompanying claims and their equivalents are intended to cover such forms or modifications as would fall within the scope and spirit of the inventions.

REFERENCE SIGNS LIST

101: ENERGY STORAGE SYSTEM
114: STORAGE-BATTERY EVALUATOR
151: INFORMATION STORAGE
152: ANALYZER
153: DISTRIBUTION EQUIVALENCE JUDGER
154: BATTERY-STATE STORAGE
156: DATA GENERATOR
158: CHARACTERISTIC CALCULATOR
159: SoH CALCULATOR
160: MAINTENANCE PLANNER
155: REFERENCE DISTRIBUTION DATABASE
111: CHARGE/DISCHARGE CONTROLLER
112: AC/DC CONVERTER
113: STORAGE BATTERY
114: STORAGE-BATTERY EVALUATOR
201: SCADA
301: ESS MONITOR SYSTEM
401: POWER GRID SYSTEM
402: TRANSFORMER

The invention claimed is:

1. A storage-battery evaluation device comprising:
a first circuit configured to:
receive a plurality of charge/discharge command values instructing charge/discharge of electric power for an energy storage device,
receive voltage values measured at the energy storage device subjected to charge/discharge by execution of the plurality of charge/discharge command values, and
generate corresponding data including voltages values and charge amounts of the energy storage device based on the received voltage values; and a second circuit configured to:
specify first charge/discharge command values of the plurality of charge/discharge command values, wherein execution of the first charge/discharge command values results in the charge amount of the energy storage device falling within a first charge-amount range, and the first charge-amount range corresponds to part of a charge-amount range of the energy storage device, obtain information indicating whether a first distribution of a relation between charge/discharge command values and frequencies based on the first charge/discharge command values satisfies a predetermined condition regarding a frequency of charge/discharge command values, specify, if the predetermined condition is satisfied, voltage values corresponding to charge amounts belonging to the first charge-amount range, based on the corresponding data, and specify a deterioration state of the energy storage device based on a second distribution of a relation between voltage values and frequencies based on the specified voltage values.

2. The storage-battery evaluation device according to claim 1, wherein
the second circuit obtains information indicating whether the frequency distribution is equivalent to a reference distribution of a relation between charge/discharge command values and frequencies thereof, and, when the first frequency is equivalent to the reference distribution, determines that the predetermined condition is satisfied.

3. The storage-battery evaluation device according to claim 2, wherein
the second circuit carries out a t-test to obtain the information indicating whether the first distribution is equivalent to the reference distribution.

4. The storage-battery evaluation device according to claim 1, wherein
the second distribution is a characteristic of variation in voltage values; wherein
the second circuit specifies the deterioration state of the energy storage device based on the characteristic calculated.

5. The storage-battery evaluation device according to claim 4, wherein
the second circuit acquires a deterioration state value of the energy storage device based on the calculated characteristic and deterioration-state evaluation data associating characteristic of variation in voltage values with deterioration state values of the energy storage device, and
specifies a deterioration state of the energy storage device based on the deterioration state value.

6. The storage-battery evaluation device according to claim 4, wherein
the characteristic is standard deviation or variance of the voltage values or a value based on one of the standard deviation or the variance.

7. The storage-battery evaluation device according to claim 4, wherein
the second circuit calculates the characteristic by further using temperature information on the energy storage device.

8. The storage-battery evaluation device according to claim 1, wherein
the charge/discharge command value specifies a charge/discharge electric-power value, and
the first distribution is a distribution of a relation between differential values of the first charge/discharge command values by time and frequencies thereof.

9. The storage-battery evaluation device according to claim 1, wherein the second circuit transmits information corresponding to the deterioration state of the energy storage device to a monitor system for the energy storage device via a communication network.

10. The storage-battery evaluation device according to claim 1, wherein
the energy storage device is:
a cell(s);
a hardware module(s) connecting the plurality of cells in series, in parallel, or in series and parallel;
a battery board(s) connecting the plurality of hardware modules in series, in parallel, or in series and parallel; or
a battery array connecting the plurality of battery boards in series, in parallel, or in series and parallel.

11. The storage-battery evaluation device according to claim 1, wherein
the second circuit generates the first distribution based on the first charge/discharge command values.

12. The storage-battery evaluation device according to claim 1, wherein the first distribution is a normal distribution approximating frequencies of the first charge/discharge command values.

13. The storage-battery evaluation device according to claim 1, wherein the second circuit determines whether a number of the corresponding data belonging to the first charge-amount range is larger than a predetermined value, and when the number is larger than the predetermined value, the second circuit specifies the first charge/discharge command values.

14. A storage-battery evaluation device comprising:
a storage battery comprising at least one battery board including a plurality module each including a plurality of cells;
a charge/discharge controlling circuit to receiver a plurality of charge/discharge command values instructing charge/discharge of electric power for an energy storage device and perform charge/discharge control for the storage battery in accordance with the plurality of charge/discharge command values;
a first circuit configured to:
receive voltage values measured at the storage battery at a time of execution of the plurality of charge/discharge command values, and
generate corresponding data including voltages values and charge amounts of the storage battery based on the received voltage values; and
a second circuit configured to:
specify first charge/discharge command values of the plurality of charge/discharge command values, wherein execution of the first charge/discharge command values results in the charge amounts of the energy storage device falling within a first charge-amount range, and the first charge-amount range corresponds to part of a charge-amount range of the energy storage device,
obtain information indicating whether a first distribution of a relation between charge/discharge command values and frequencies based on the first charge/discharge command values satisfies a predetermined condition regarding a frequency of charge/discharge command values,
specify, if the predetermined condition is satisfied, voltage values corresponding to charge amounts belonging to the first charge-amount range, based on the corresponding data, and specify a deterioration state of the energy storage device using a second distribution of a relation between voltage values and frequencies based on the specified voltage values.

15. A storage-battery evaluation method comprising:
receiving a plurality of charge/discharge command values instructing charge/discharge of electric power for an energy storage device,
receive voltage values measured at the energy storage device subjected to charge/discharge at a time of execution of the plurality of charge/discharge command values;
generating corresponding data including voltages values and charge amounts of the energy storage device based on the received voltage values;
specifying first charge/discharge command values of the plurality of charge/discharge command values, wherein execution of the first charge/discharge command values results in the charge amounts of the energy storage device falling within a first charge-amount range, and the first charge-amount range corresponds to part of a charge-amount range of the energy storage device:
obtaining information indicating whether a first distribution of a relation between charge/discharge command values and frequencies based on the first charge/discharge command values satisfies a predetermined condition regarding a frequency of charge/discharge command values;
specifying, if the predetermined condition is satisfied, voltage values corresponding to charge amounts belonging to the first charge-amount range, based on the corresponding data; and
specifying a deterioration state of the energy storage device using a second distribution of a relation between voltage values and frequencies based on the specified voltage values.

* * * * *